United States Patent [19]

Lee

[11] 4,319,288
[45] Mar. 9, 1982

[54] CURRENT INJECTION TAPPED DELAY LINE SPECTRAL SHAPING EQUALIZER AND DIFFERENTIATOR

[75] Inventor: Patrick S. K. Lee, Campbell, Calif.

[73] Assignee: Sperry Corporation, New York, N.Y.

[21] Appl. No.: 138,614

[22] Filed: Apr. 9, 1980

[51] Int. Cl.³ .............................................. G11B 5/09
[52] U.S. Cl. ...................................... 360/46; 360/40; 360/45
[58] Field of Search .............................. 360/40, 45, 46

[56] References Cited

U.S. PATENT DOCUMENTS

| | | | |
|---|---|---|---|
| 3,516,066 | 6/1970 | Jacoby | 360/43 |
| 3,775,759 | 11/1973 | Armitage, Jr. et al. | 360/45 |
| 4,081,756 | 3/1978 | Price et al. | 360/45 |

OTHER PUBLICATIONS

"A 6K BPI Disk Storage Using Mod–II Interface" by A. P. Geffon, IEEE Transactions on Magnetics, vol. Mag-13 #5, Sep. 1977.

"Signal-Processing Circuit for Magnetic Data Recording" by D. M. Taub, IBM T.D.B., vol. 20, No. 5, 10/77.

Primary Examiner—Vincent P. Canney
Attorney, Agent, or Firm—Thomas Schneck, Jr.; Eugene T. Battjer; William E. Cleaver

[57] ABSTRACT

A tapped delay line (38) terminated with its characteristic impedance at both ends is connected to receive a differential input signal in intermediate taps (27, 29) of a delay line. Delay line taps (25, 27, 29, 31), as well as ends (21, 23) are connected symmetrically to two pair of summing networks (59, 61 and 83, 85) where voltage signal components having different delays from the input signal are linearly combined. One pair of summing networks (59, 61) produces a balanced differential output signal which is an amplitude equalized and differentiated version of the input signal, while the other pair of summing networks (83, 85) produces another balanced differential output signal which is a different amplitude equalized version of the input signal. Each version is needed in one of the channels of a dual channel signal detector for detecting the peaks of the variable amplitude input signal.

12 Claims, 8 Drawing Figures

CURRENT INJECTION TAPPED DELAY LINE SPECTRAL SHAPING EQUALIZER AND DIFFERENTIATOR

BACKGROUND OF THE INVENTION a. Field of the Invention

The invention relates generally to the processing of analog or digital signals and in particular to a circuit for use in amplitude spectrum equalization and differentiation of signals the peaks of which are representative of digital data.

b. Prior Art

In signal processing and in particular the magnetic data storage and retrieval art, equalization or waveform compensation is the term applied to the process of shaping signals, e.g. those picked up by a magnetic read head in digital magnetic recording, so that data bits can be recovered accurately. The readback signal of digital magnetic recording is a summation of isolated pulses each of which is similar to a bell-shaped curve and can be characterized as a Lorentzian pulse in the time domain. The peak of each of these isolated readback pulses represents a written transition on the storage medium. These readback pulses are essentially unbound in time and have long tails preceding and following the peak of the pulse. Therefore one reason that equalization is necessary in magnetic storage playback is that magnetic flux transitions are recorded so densely on the storage medium, that adjacent readback pulses can influence each other to cause pulse crowding or pulse interference. This pulse crowding phenomenon results in peak shift or bit shift and also pattern dependent amplitude variation. By means of amplitude spectrum equalization of the unequalized readback isolated pulses, the after equalization pulse is completely bound in time and its signal level returns to zero in a relatively shorter time and remains there. If the signal level of each equalized isolated pulse drops to a nearly zero signal level before the occurrence of the peak of the next pulse, then pulse interference or pulse crowding is eliminated. This pulse slimming or pulse narrowing technique corrects for peak shift and variable peak amplitude problems in the unequalized readback signal waveform. This correction means yields a readback signal waveform whose amplitude is frequency and data independent, i.e. a constant peak amplitude output signal, and whose peaks have negligible peak shift. An amplitude equalizer should cause minimum degradation of the signal to noise ratio and also cause a minimum amount of ringing on the baseline of the equalized isolated pulse.

In equalizers of the prior art, such as in U.S. Pat. No. 4,081,756 to R. Price, G. Jacoby and A. Geffon the equalized signal is transmitted to a peak detection channel which includes a differentiation circuit to define the peak positions of the signal and a detector, such as a zero crossing detector, produces digital pulses representing peaks of the readback signal, which consist of true data peaks and noise induced peaks. By means of the equalization and ideal differentiation, the timing accuracy of the relative peak positions of the readback signal representing the digital information written on the medium is maintained. In the aforementioned patent the equalized signal is also transmitted to another amplitude detection channel, referred to as the "gate generator", to produce pulses or gates whenever the constant peak amplitude signal exceeds a predetermined threshold. These gates, corresponding to the true data peaks, are used to examine and indicate the true data peak positions detected by the peak detection channel. In short, use of an equalizer to shape the amplitude spectrum of the input signal so as to slim the isolated pulse and compensate the amplitude of the composite waveform can increase the magnetic storage density.

The above patent shows a balanced equalizer in FIG. 11. Two separate delay lines were terminated by emitter followers to approximately simulate open circuit termination in an attempt to provide total signal reflection. An input to each delay line was cross-connected to the output of the other delay line through another emitter follower and the two cross-connects were used as inputs to a differential amplifier, followed by a Bessel filter. This equalizer is suitable for shaping the input signal to a dual channel signal detector, as described in the patent. One channel, including a differentiator and a zero-crossing detector, is used for peak detection. The other channel is used for amplitude detection, i.e. gate generation, over a threshold level and is known as a "gate generator". The outputs of both channels are fed to an AND gate which produces the digital output readback signal. Note that equalization and differentiation in the above patent were achieved using different circuits.

In U.S. Pat. No. 3,516,066 issued on June 2, 1970, G. V. Jacoby discloses an equalizer comprising amplitude and phase compensation circuits followed by a delay line differentiator. The theory of delay line differentiators is also discussed in an article entitled "The Use of Delay Lines in Reading a Manchester Code" by T. H. Chen in IEEE Transactions on Computers, September, 1968.

In the book entitled "Data Transmission", by Bennett and Davey, p. 269, there is a discussion of transversal filters formed by tapped delay lines. The author points out that any correction in amplitude characteristics of a signal with respect to frequency can be brought about by a transversal filter. Note that such a transversal filter has a single ended input and single ended output, and is therefore unbalanced.

In U.S. Pat. No. 3,408,640 issued on Oct. 29, 1968, Masson discloses two separate tapped delay lines for use in reading high density magnetically recorded data. Selected taps in each branch are connected to a resistor summing network for equalizing data waveforms. The two separate delay line branches are terminated in their characteristic impedances and are used in an unbalanced manner like the transversal filter.

While the equalizers of the prior art are quite useful, there is a need for improved equalization. For optimum performance in read signal detection, it is desirable to have two separate amplitude spectrum equalizers, one for a peak detector and one for a gate generator, and it is also desirable to have a delay line differentiator. However, implementation of separate delay line equalizers and a differentiator into the system is not only expensive but also generates more electronic noise and delay line matching difficulties.

SUMMARY OF THE INVENTION

An object of the present invention is to provide a balanced differential tapped delay line circuit which provides two separate amplitude spectrum equalization and one differentiation functions for both waveform compensation and signal differentiation.

The above object has been achieved by means of a symmetrically tapped delay line receiving a variable peak amplitude input signal, e.g., representative of magnetically recorded digital data, along differential input lines and connected to a plurality of signal summing junctions each, in turn, connected to selected taps and ends of the delay line. By selective combination of the input signal and the signals from selected taps and ends of the delay line, two output signals can be formed. A first output signal is a shaped version of the input signal to compensate for or equalize peak amplitude variations, and a second output signal is a differentiated version of an amplitude equalized input signal. Both output signals are double ended, balanced, differential signals and are used in a dual channel signal detector for amplitude and peak detection.

The delay line is center fed by a differential current input signal after converting a differential voltage input signal to a current signal. Ends of the delay line are terminated in characteristic impedances and a plurality of taps are symmetrically spaced between the ends at intervals forming equal delay elements. The delay line is used in a balanced differential mode. The taps and ends of the delay line provide component signals with incremental delays from the input signal to two pairs of summing networks. The first pair of summing networks combine these component signals and the input signal to form a pair of differential signals incorporating delays of zero, one and two delay element times to the double ended input signal. These two signals are then combined to produce the first output signal which is the slimmed version of the input signal for use in amplitude detection. The second pair of summing networks just combine the component signals to form another pair of differential signals incorporating delays of zero, one, two and three delay element times to the input signal and being combined to produce the second output signal which is the slimmed and differentiated version of the input signal for use in peak detection by means of zero crossing detector.

An advantage of the present invention is that the component signals developed along the symmetrically tapped delay line are self-balanced. Another advantage is that a single circuit component performs the dual functions of two different peak amplitude equalizations and a signal differentiation needed in a dual channel signal detector. Another advantage is that by injecting current into the center of a tapped delay line, an unlimited number of delay line elements can be driven thereby giving the opportunity to generate a wide variety of wave shapes.

DESCRIPTION OF THE PREFERRED EMBODIMENT

Figure 1:
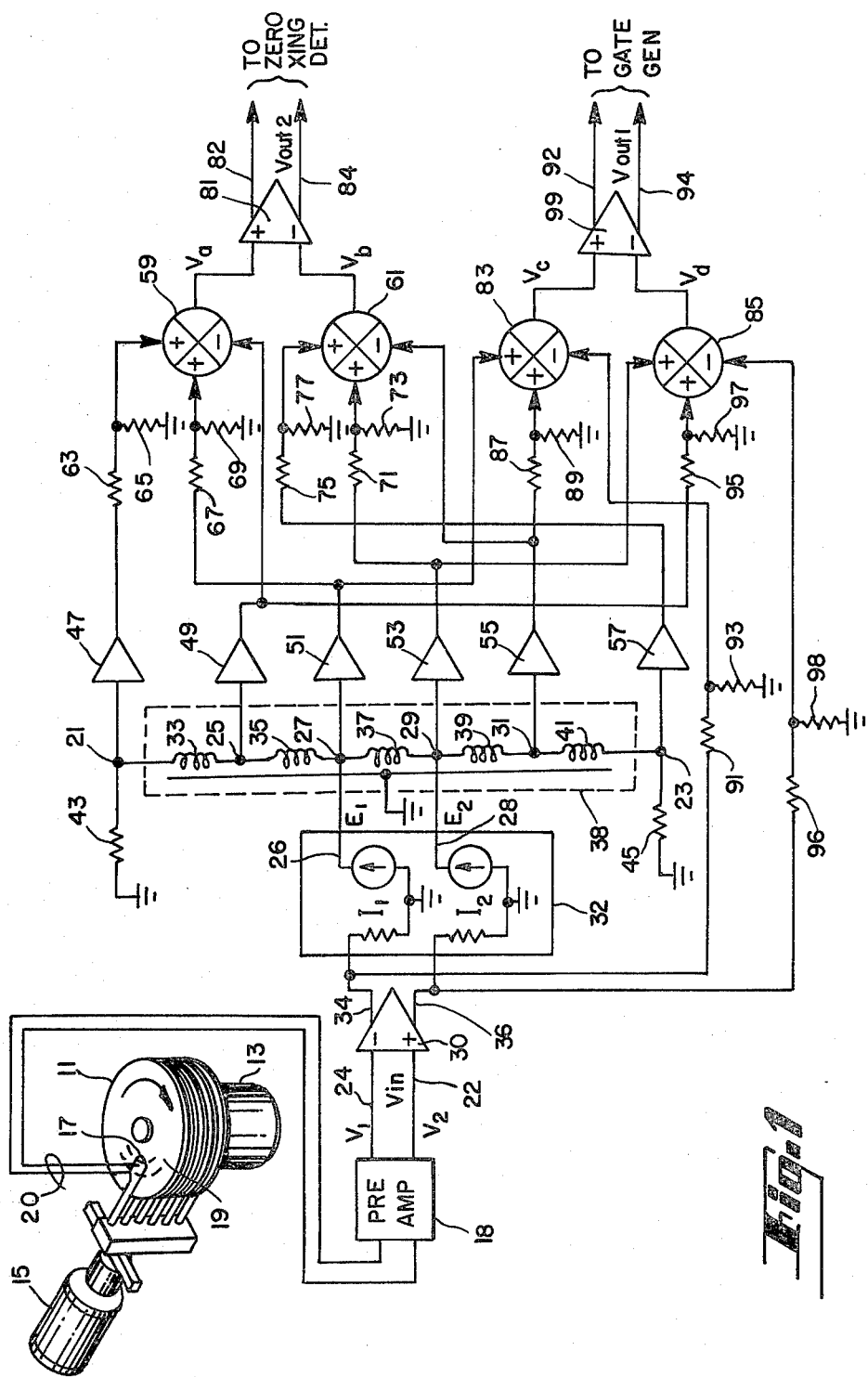
FIG. 1 is a schematic drawing of the present invention shown in a dual channel system for reading data recorded on a magnetic disk.

The schematic of FIG. 1 shows a disk pack 11 having magnetic disks rotating in the direction indicated by the arrow by means of rotational force applied by the motor 13. A linear motor 15 sets the position of the magnetic head 17 relative to tracks 19 on a disk passing beneath the head 17. Differential output signals from magnetic head 17 are taken along the wires 20 and transmitted to a signal preamplifier 18, which is a differential amplifier. The input signal to preamplifier 18 is derived from opposite ends of a coil which is part of the magnetic head pickup assembly. The output of preamplifier 18 is also a differential signal.

While the present application discusses amplitude spectrum equalization for pulse slimming or shaping and differentiation of signals derived from magnetic media, and disks in particular, it should be realized that the present invention has applicability to the general field of analog or digital signal processing and is not restricted to reading of magnetically recorded digital data. If other than magnetically read data is processed, a differential input signal would be applied to a preamplifier 18 or directly into the circuit of the present invention shown in FIG. 1.

The differential output signal of the preamplifier 18 is connected by means of lines 22, 24 to a constant gain amplifier 30, having a gain "k", which has differential voltage outputs along lines 34, 36. These outputs are connected to a voltage-to-current converter 32 with transconductance $G_m$ which supplies differential output currents along lines 26, 28. The transconductance of the converter is the ratio of output current to input voltage and is set equal to the reciprocal of the load impedance seen by the output current sources of the converter. These differential current outputs are connected to a tapped delay line 38 which is surrounded, except for first and second ends, 21, 23, by a dashed line. Delay line 38 besides having the first and second ends 21, 23 has a plurality of intermediate taps 25, 27, 29 and 31. The current output lines 26 and 28 are connected to the two control intermediate taps 27, 29 so that delay line 38 is center fed by current from converter 32.

The intermediate taps 25, 27, 29 and 31 are symmetrically disposed between the end taps 21 and 23. The end taps and the intermediate taps define five delay line sections 33, 35, 37, 39 and 41. These delay line sections have the same time delay of say T nanoseconds. First and second delay line ends 21 and 23 are terminated in the resistors 43, 45, respectively. Each of these resistors has an opposite end connected to ground and is characterized by a resistance, $Z_o$, which is equal to the characteristic impedance of the delay line 38. This type of termination prevents signal reflections in the delay line. The load resistance of the delay line seen by each of the two current signal sources ($I_1$ and $I_2$) is equal to $Z_o/2$. Each of the opposite delay line ends 21 and 23, as well as each of the intermediate taps 25, 27, 29 and 31 is connected to a buffer amplifier 47, 57, 49, 51, 53, and 55. Each of these buffer amplifiers has unity gain and serves to isolate the delay line from the summing junctions to which the outputs of the buffer amplifiers are connected.

Two pair of summing junctions are provided. These summing junctions are implemented with summing networks. A first pair comprises the summing junctions 59 and 61. Summing junction 59 receives an input from buffer amplifier 47 through the gain multiplier formed by resistor 63 having a value R11 and resistor 65 having a value R12. Summing junction 59 also receives an input from buffer amplifier 51 through the gain multiplier formed by resistors 67 and 69. Resistor 67 also has the value R11, while resistor 69 has the value R12. A third input to summing junction 59 is applied from the output of buffer amplifier 49. Then the summing junction 59 will sum the first two inputs and subtract the third input to produce an output signal $V_a$.

Figure 2:
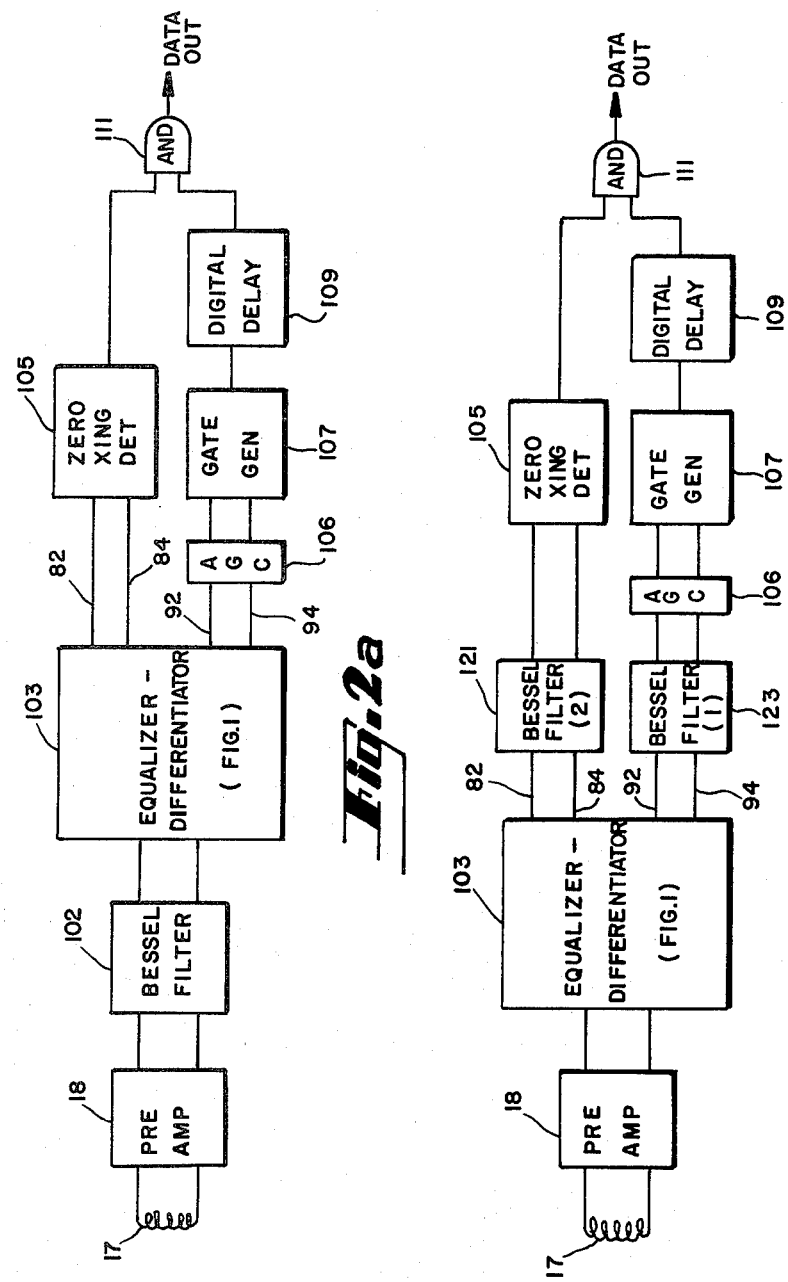
FIGS. 2a and 2b are simplified block diagrams showing alternate placements of the circuit of FIG. 1 in a dual channel data readback system.

The second summing junction 61 receives an input from buffer amplifier 53 through the gain multiplier formed by resistors 71 and 73. Resistor 71 has a value R11 while resistor 73 has a value R12. A second input is applied to the summing junction 61 from buffer amplifier 57 and through the gain multiplier formed by the resistors 75 and 77. These resistors have respective values R11 and R12, similar to the resistors 71 and 73. A third input is applied to summing junction 61 from buffer 55. Then the summing junction 61 sums the first two inputs and subtracts the third input to generate an output signal $V_b$. The outputs of the summing junctions 59 and 61 are then applied as a differential signal to the constant gain amplifier 81 which has output lines 82, 84 connected to the zero crossing detector circuit, as shown in FIGS. 2a and 2b. The gain of amplifier 81 is termed $G_{12}$.

A second pair of summing junctions 83, 85 receives other inputs from the buffer amplifiers as well as from the voltage signal source at the input of the converter 32. Summing junction 83 has a first input from buffer amplifier 55 through the gain multiplier formed by resistors 87 and 89. Resistor 87 has a value R13 while resistor 89 has a value R14. A second input is applied to junction 83 from buffer amplifier 51. A third input to the same junction is supplied from one of the differential input lines 34 through a gain multiplier formed by the resistors 91, 93. Resistor 91 has a value R15 while resistor 93 has a value equal to R16. The summing junction 83 then sums the first two inputs and subtracts the third input to generate an output signal $V_c$.

Summing junction 85 has a first input from buffer amplifier 49 through the gain multiplier formed by resistors 95, 97. Resistor 95 has a value equal to R13 while resistor 97 has a value equal to R14. Second input to the summing junction 85 is taken from buffer amplifier 53. A third input to summing junction 85 is applied from the second differential input line 36 through the gain multiplier formed by the resistors 96, 98. Resistor 96 has a value equal to R15 while resistor 98 has a value equal to R16. The summing junction 85 then sums the first two inputs and subtracts the third input to generate an output signal $V_d$. The outputs from summing junctions 83 and 85 are then combined by the constant gain amplifier 99, having a gain $G_{11}$, and having a pair of output lines 92, 94 connected to a gate generation (amplitude detection) channel. The channel includes an automatic gain control circuit 106, a gate generator circuit 107 and a digit delay circuit 109, as shown in FIGS. 2a and 2b.

All the gain multipliers mentioned above have gain less than one and therefore function as attenuators. The gain of amplifier 30 is equal to k, which is larger than 1, while the gains of the gain multipliers are set as follows:

$$\frac{R12}{R11 + R12} = a$$

$$\frac{R14}{R13 + R14} = b = \frac{1}{k}$$

$$\frac{R16}{R15 + R16} = c = (k - 1)/k$$

Then the output $V_{out\,1}$ from differential amplifier 99 for gate generation channel forms a voltage transfer function with respect to the input signal $V_{in}$ at the input of amplifier 30 as follows:

$$H_{11}(f) = [K_{11}(1 - K_{12} \cos \omega T)]e^{-j\omega T} \quad (1)$$

The output $V_{out\,2}$ from differential amplifier 81 for zero crossing detection forms another voltage transfer function with respect to the input signal $V_{in}$ as follows:

$$H_{12}(f) = \left[ K_{13}(1 - K_{14} \cos \omega T) \cdot j \sin\left(\frac{\omega T}{2}\right) \right] e^{-j\omega(3T/2)} \quad (2)$$

where
$K_{11} = G_{11}(1+k)$ and $G_{11}$ is the gain of amplifier 99,
$K_{12} = 2/(1+K)$
$K_{13} = 2G_{12}k$ and $G_{12}$ is the gain of amplifier 81, and
$K_{14} = 2R12/(R11+R12)$
T = delay of each delay line section.
In equations (1) and (2) the cosine equalization terms $$F_{11}(f) = K_{11}(1 - K_{12} \cos \omega T)$$

and $$F_{22}(f) = K_{13}(1 - K_{14} \cos \omega T)$$

represent amplitude spectrum shaping terms, while the sine term represents a differentiation term. The transfer functions of equations (1) and (2) act on the variable peak amplitude input waveform resulting from superposition of isolated pulses of Lorentzian shape, expressed by the equation $$L(t) = 1/1 + (2t/T_{50})^2$$

where t denotes time and $T_{50}$ is the time width between half normalized peak amplitude points before shaping. Equation (1) represents the voltage transfer function of the circuit of FIG. 1 for the gate generation channel and the circuit is therefore used primarily as an amplitude spectrum equalizer for pulse slimming. Equation (2) represents the voltage transfer function of the circuit of FIG. 1 for zero crossing detection and the circuit is therefore used primarily as an amplitude spectrum equalizer for pulse slimming and secondarily as a differentiator to define the peak positions of the input signals by the zero crossings.

In order to show how to derive the equations (1) and (2) and explain the operation of the circuit, let $V_1$, $V_2$ represent the double ended differential a.c. small signals at the input of the differential amplifier 30 of gain k and let $I_1$, $I_2$ represent the equivalent a.c. current sources of the voltage to current converter 32 which inject small current signals into the center of the delay line 38 through the lines 26, 28. The transconductance $G_m$ of the voltage to current converter is set equal to the reciprocal of the load impedance seen by each current source, which is equal to half of the characteristic impedance $Z_o$ of the delay line. Therefore if only one current source is active, then the voltage signal developed at the output of that particular current source (that is, at one end of the center section 37 of the tapped delay line 38) is equal to the corresponding single ended input voltage of the converter 32 which generates that particular current signal source. For example, if only $I_1$ is active and $I_2$ is disconnected then the voltage signal at tap 27, $E_1$, which is considered as unbalanced center tap voltage signal in the following description, is equal to $I_1(-Z_o/2) = kV_1$ where $kV_1$ is the single ended input voltage of the converter on line 34. Similarly, the unbalanced center tap voltage signal $E_2$ at tap 29 on the other side of the center section of the delay line is equal to $kV_2$. By means of superposition property, any output voltage signal taken from any one of the taps 21, 25, 27, 29, 31, 23 of the tapped delay line is made up of two signal components. The first signal component is derived from the unbalanced tap voltage signal at tap 27 and is equal to $kV_1(t-mT)$ where mT is the total delay of the number, m, of delay sections between the center tap 27 and the particular tap of the delay line from which the output signal is taken. The second signal component is derived from the unbalanced tap voltage signal at tap 29 and is equal to $kV_2(t-nT)$ where nT is the total delay of the number, n, of delay sections between the center tap 29 and the particular tap of the delay line from which the output signal is taken. Therefore in time domain, the signal at any particular tap of the delay line, $V_j$, can be represented by the following equations:

$$V_j(t) = kV_1(t-mT) + kV_2(t-nT) \text{ in time domain}$$

and $$V_j(f) = kV_1(f)e^{-j\omega(mT)} + kV_2(f)e^{-j\omega(nT)} \text{ in frequency domain}$$

The subscript j denotes the tap location where the signal is taken out and which can be any one of the six taps 21, 25, 27, 29, 31, 23. $V_1(f)$ and $V_2(f)$ are the Fourier transforms of $V_1(t)$ respectively. After passing through buffer amplifiers and corresponding gain multipliers with gain equal to one, a or b, these signals taken from the taps of the delay line are fed to the summing junctions 59, 61, 83, and 85. Differential voltage signals on lines 34, 36 at the input of the converter 32 are also fed to summing junction 83, 85 after passing through the gain multiplier with gain equal to c. Then all these signals are selected and summed as shown in FIG. 1 to produce the resultant signals $V_a$, $V_b$, $V_c$, $V_d$ at the output of the summing networks 59, 61, 83 and 85 respectively, where $V_a = -V_b$ and $V_c = -V_d$. These resultant signals at the summing junction outputs are therefore formed by summing (adding and subtracting) linear combinations of voltage signal components delayed from the input signals ($V_1$, $V_2$) through various numbers (zero to three) of delay elements each of which has delay time T.

As shown in the circuit of FIG. 1 for gate generation channel, $V_c$ is formed by three inputs. The first input to summing junction 83 is the voltage signal from buffer amplifier 55 and is the combination of two signal components; one component is the signal delayed from $E_2$ by one delay element and another component is the signal delayed from $E_1$ by two delay elements. Each delay element has delay time T. The second input to summing junction 83 is the voltage signal from the buffer 51 and is formed by combining $E_1$ through zero delay and $E_2$ through one delay element. The third input to summing junction 83 is directly derived from the signal on line 34 at the input of the converter 32 and consists of only one signal component. Similarly, the inputs to summing junction 85 to generate $V_d$ have similar relationship with $E_2$, $E_1$ and the signal on line 36. The spectrum (Fourier transform) at the output of summing junction 83 has the following relationship with respect to the input signals.

$$V_c(f) = V_2(f)[(1+k)e^{-j\omega T}] + V_1(f)[1 + e^{-j\omega(2T)}]$$

The above expression can be used for $V_d(f)$ at the output of summing junction 85 when $V_1(f)$ is replaced by $V_2(f)$ and vice versa in the expression for $V_c(f)$. The output $V_{out\,1}(f)$ of the differential amplifier 99 in frequency domain is therefore equal to the difference of $V_c(f)$ and $V_d(f)$, multiplied by the gain $G_{11}$ of the amplifier 99. The relationship between the input $V_{in}(f)$ and the output $V_{out\,1}(f)$ of the amplitude equalization circuit is shown below.

$$\frac{V_{out1}(f)}{V_{in}(f)} = G_{11}(1+k)\left[1 - \left(\frac{1}{1+k}\right)(e^{j\omega T} + e^{-j\omega T})\right] \cdot e^{-j\omega T}$$

Representing the constants of the above expression by $K_{11}$, $K_{12}$ and making use of the Euler's theorem of trigonometric identities, the transfer function $H_{11}(f)$ of the amplitude equalizer in FIG. 1 for the gate generation channel can be derived as shown in equation (1) previously.

For the peak detection channel, $V_a$ and $V_b$ at the output of summing junctions 59, 61 are generated by summing three different inputs. The first input to summing junction 59 which comes from the buffer amplifier 47 is a linear combination of two signal components: one component is the unbalanced signal $E_1$ delayed by two delay elements and another component is the unbalanced signal $E_2$ delayed by three delay elements. The second input to summing junction 59 which comes from buffer 51 is formed by the linear combination of $E_1$ through no delay and $E_2$ through one delay element. The third input to summing junction 59, which comes from the buffer 49 and is subtracted from the summation of the first two inputs, is formed by the combination of $E_1$ through one delay element and $E_2$ through two delay elements. Similarly, the inputs to summing junction 61 have similar relationship with $E_2$, $E_1$ as if the relationship between the inputs to summing junction 59 and $E_1$, $E_2$ respectively. The signal at the output of summing junction 59 therefore has the following frequency spectrum.

$$V_a(f) = k\{V_2(f) \cdot [ae^{-j\omega(3T)} - e^{-j\omega(2T)} + ae^{-j\omega T}] + V_1(f) \cdot [ae^{-j\omega(2T)} - e^{-j\omega T} + a]\}$$

$V_b(f)$ at the output of summing junction 61 has similar expression as $V_a(f)$ when $V_2(f)$ is replaced by $V_1(f)$ and vice versa in the above expression. The output $V_{out\,2}(f)$ of the differential amplifier 81 in frequency domain is therefore equal to the difference of $V_a(f)$ and $V_b(f)$, multiplied by the gain $G_{12}$ of the amplifier 81. In terms of the input signal $V_{in}(f)$, the output signal $V_{out\,2}(f)$ has the following characteristic.

$$V_{out\,2}(f) = V_{in}(f) \cdot G_{12} k[-a + (1+a)e^{-j\omega T} - (1+a)e^{-j\omega(2T)} + ae^{-j\omega(3T)}]$$

where 'a' is the gain of the multipliers formed by the resistor network of R11, R12.

Making use of the Euler's theorem of the trigonometric identities, the transfer function $H_{12}(f)$ of the spectral shaping differentiation circuit in FIG. 1 that is connected to the zero crossing detection circuit can be derived as shown in equation (2) previously.

While only signal components delayed from the input by zero to three delay times are combined to yield equations (1) and (2), the ability of the input signal to propagate through the multiple delay elements shown in FIG. 1 rests on the injection of current into the intermediate taps 27 and 29 of FIG. 1. This current injection allows propagation of the input signals through all of the delay elements at both sides of the intermediate taps. Without such current injection, it is difficult to generate signal sources at the center of the delay line.

A Bessel filter is connected to the equalization and differentiation circuit of the present invention so that the Bessel filter transfer function multiplies with the transfer function of the circuit to yield the required spectral shaping equalizer and differentiator. As shown in FIG. 2a, a Bessel filter 102 may be placed intermediate of the preamplifier circuit 18 and the equalizer-differentiator 103 of the present invention which is described in detail with reference to FIG. 1. The output of the equalizer-differentiator 103 is taken along a first pair of lines 82, 84 connected to the zero-crossing detection circuit 105 of a dual channel signal detector, which detects the zero-crossings of the equalized and differentiated version of the input signal to indicate the peak positions of the equalized input signal. So the zero-crossing detector can be viewed as a peak detection channel. The output along lines 82, 84 is governed by the voltage transfer function of equation (2). The output of zero crossing detector circuit 105 is transmitted to the AND gate 111. A second output from the equalizer-differentiator circuit 103 is taken along lines 92, 94 and transmitted to the gate generation circuit 107 of a dual channel signal detector after passing through an automatic gain control circuit 106 to provide a fixed peak amplitude signal level for the gate generation. The signal along lines 92, 94 is governed by the voltage transfer function of equation (1). Voltge transfer function means output voltage signal divided by the input voltage signal. The output of gate generator circuit 107 is transmitted to the digital delay circuit 109 where the input pulse is delayed by T/2 and then transmitted to AND gate 111 for examining the output of zero-crossing detector circuit 105 to discriminate the true peak positions from the noise induced peaks. Presence of two high inputs to the AND gate 111 yields a digital data output pulse, which represents each magnetization transition written on the medium.

With reference to FIG. 2b an alternate and preferred configuration for use of the equalizer-differentiator circuit 103 is shown. The circuit receives an input directly from the pre-amplifier circuit 18, but the Bessel filter, instead of preceding the equalizer-differentiator circuit is placed at the output of the equalizer-differentiator circuit. The output lines 92 and 94 have a first Bessel filter 123 connected thereto. The other output pair of lines 82, 84 have a second Bessel filter 121 connected thereto. The advantage of the configuration of FIG. 2b is that the Bessel filters need not be identical, but may be tailored for better noise rejection and to achieve the required optimum equalization waveforms. The outputs of the Bessel filters 121, 123 are respectively connected to the zero-crossing detector circuit 105 and to the A.G.C. circuit 106 followed by the gate generator circuit 107 as shown in FIG. 2b. The output of gate generator circuit 107 is transmitted through the digital delay circuit 109 to AND gate 111. The output of zero-crossing detector circuit 105 is also transmitted to AND gate 111. Simultaneous pulses from both channels serve to generate the true readback data output pulses from AND gate 111.

Each Bessel filter has a transfer function of B(f), which combines with the transfer function H(f) resulting from each pair of summing junctions of FIG. 1 to produce a transfer function C(f) for the gate generation channel and D(f) for the peak detection channel. Each such transfer function C(f) and D(f) is the product of the Bessel filter transfer function B(f) multiplied by the voltage transfer function $H_{11}(f)$ or $H_{12}(f)$ of the present invention to generate the desired equalization and differentiation functions as discussed in detail below.

Figure 3:
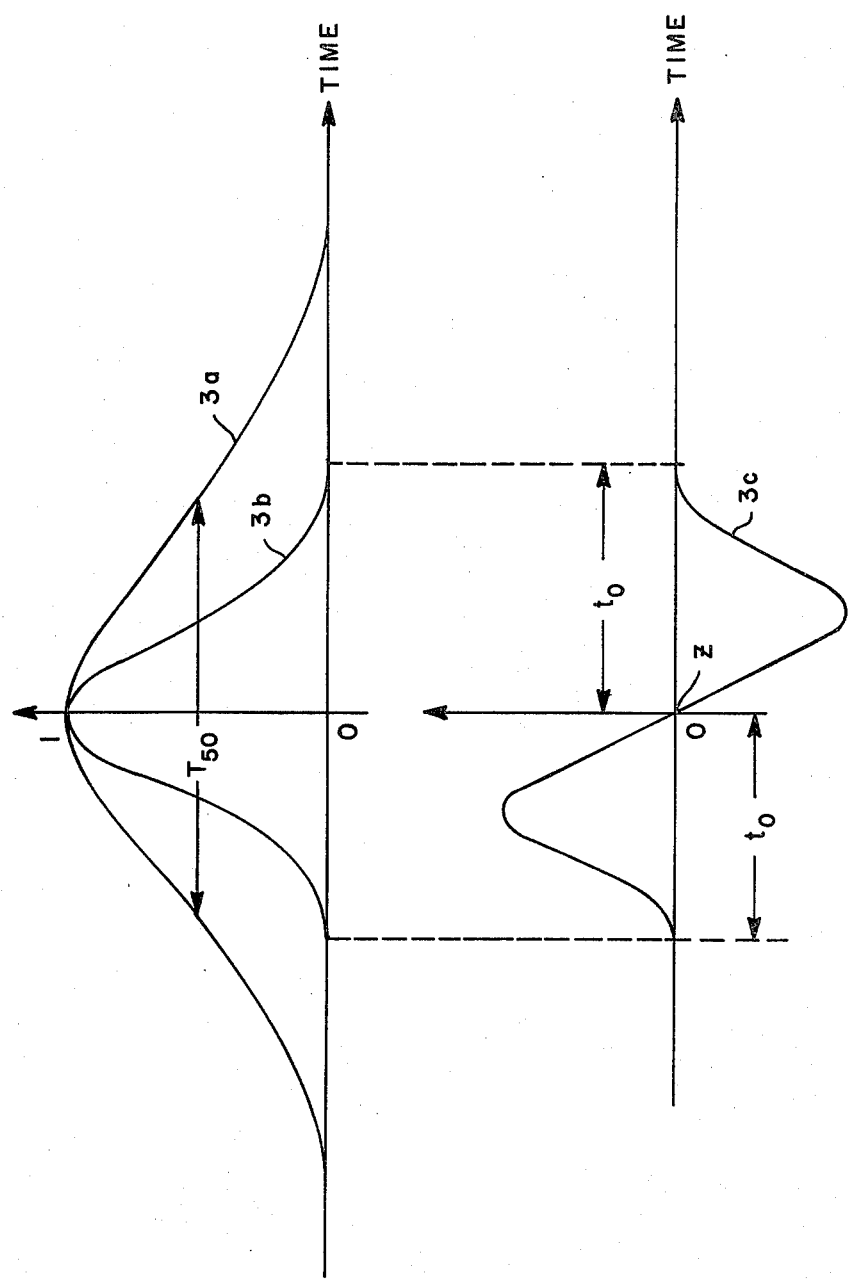
FIG. 3 shows the waveform compensation and differentiation achieved by the present invention.

It has been known that the unequalized readback isolated pulse as shown in FIG. 3 waveform 3a has a Fourier transform of $L(f) = e^{-\pi T_{50} f}$ where $T_{50}$ is the time duration of the readback pulse at the half peak amplitude point. The desired (slimmed) isolated pulse is shown in waveform 3b of FIG. 3 and has Fourier transform of S(f). For instance S(f) can be set equal to $$\cos^4\left(\frac{\pi f}{2f_c}\right)$$

where $f_c$ is the system bandwidth or cutoff frequency for the slimmed isolated pulse. Note S(f) can also be derived by means of other approaches and the circuitry in this invention is therefore not limited to the application for cosine fourth power amplitude spectrum equalization. Waveform 3c in FIG. 3 represents the desirable differentiated isolated pulse. Both the slimmed isolated pulse and its differentiated signal are slimmed to $\pm t_o$ nanoseconds from the zero time reference at the peak position of the unequalized pulse 3a or the zero-crossing Z of 3c. Therefore both pulses 3b and 3c are substantially flat beyond the zero touching points at $\pm t_o$ from the peak representative zero crossing Z, and these points are made to correspond to the minimum pulse or transition interval $T_{min}$ so as to eliminate pulse interference between adjacent isolated pulses. The position at which other pulses or transitions occur at intervals greater than the minimum pulse interval $T_{min}$ is of no significance because the equalized (slimmed) isolated pulse 3b and the equalized differentiated pulse represented by 3c in FIG. 3 are substantially flat at the zero level at positions beyond the minimum pulse interval which depends on the code used in digital magnetic recording. The amplitude spectrum of the equalized and differentiated pulse 3c theoretically should be $S(f) \cdot 2\pi f$ but to a close approximation within the system frequency range, it can be represented by $$[S_o(f)] \cdot 2 \sin \frac{\pi f}{f_c} = N(f)$$

where $S_o(f)$ is the same as $S(f)$ except with slightly larger bandwidth to compensate the effect due to the difference between the ideal differentiation $2\pi f$ and the SIN function used as differentiation.

Figure 4:
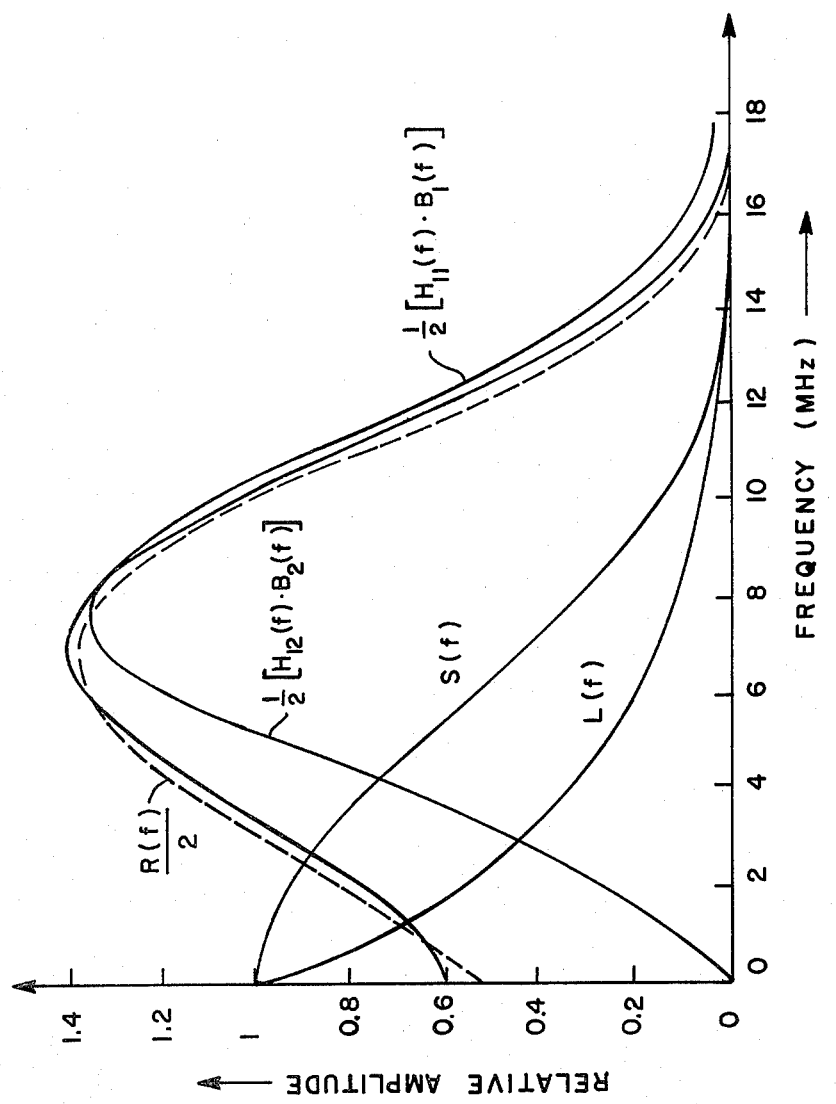
FIG. 4 is a graph of the relative amplitude spectrum plotted against frequency of Fourier transforms for an isolated readback data pulse, before and after spectral shaping. The graph also shows the transfer functions associated with the present invention.

FIG. 4 shows the relative amplitude of the amplitude spectrums of the isolated pulse signal waveform before and after equalization and differentiation. In order to transform the unequalized Lorentzian isolated pulse, 3a, with Fourier transform $L(f)$ into a slimmed isolated pulse 3b with said cosine fourth power spectrum $S(f)$, the required equalization $R(f)$ is thus equal to $S(f)/L(f)$ and can be represented mathematically to a close approximation as $$R(f) = [K_{11}(1 - K_{12} \cos \omega T)] \cdot B_1(f)$$

which is equivalent to $C(f) = H_{11}(f) \cdot B_1(f)$, where $H_{11}(f)$ is the equalization transfer function shown in equation (1) and generated by a first half of the circuit of the present invention, i.e. the inputs and outputs of summing junctions 83 and 85 in FIG. 1 to yield a slimmed readback signal for the gate generation channel. $K_{11}$, $K_{12}$ are design constants. $T = 1/f_d$ is a frequency scaling parameter and is equal to the time delay of each delay line section. $B_1(f)$ is the transfer function of a fourth order Bessel filter 123 with corner frequency $f_{B1}$. The Bessel filter is used to help the shaping of the amplitude spectrum equalization so that the result is more close to $S(f)/L(f)$, and is also used to reject high frequency noise outside the system bandwidth. In order to detect the peak position of an unequalized pulse, the equalized pulse is differentiated so that the zero crossing of the differentiated pulse can be detected to define the peak or data bit position. Delay line differentiator having a SIN $\pi fT$ transfer function is preferred because it maximizes the signal amplitude at the signal frequency range, but minimizes the high frequency noise reseponse by means of its fixed maximum gain. In this invention, the delay line differentiator and another equalizer are generated by the second half of the circuit in this invention, i.e. the inputs and outputs of summing junctions 59 and 61, as shown by the transfer function $H_{12}(f)$ of equation (2). In other words, this invention uses the same tapped delay line circuit to incorporate another spectral shaping equalization into a delay line differentiator in order to yield an optimum, slimmed and differentiated readback signal for peak detection with negligible pulse interference problems. Therefore combining the transer function $H_{12}(f)$ of the balanced tapped delay line spectral shaping differentiator and the transfer function $B_2(f)$ of the fourth order Bessel filter 121 with corner frequency $f_{B2}$, the desired equalization-differentiation function for optimum differentiated readback signal can be produced as $$D(f) = H_{12}(f) \cdot B_2(f) =$$
$$\left[ K_{13}(1 - K_{14} \cos \omega T) \cdot j \sin \frac{\omega T}{2} \cdot e^{-j\omega(1\frac{1}{2}T)} \right] \cdot B_2(f)$$

where $K_{13}$, $K_{14}$ are design constants. Since the delay line differentiation function $$\sin \frac{\omega T}{2}$$

is not exactly equal to those of ideal resistor-inductor or resistor-capacitor type differentiators in the signal frequency range, the differentiated pulse by means of delay line differentiator has a wider baseline width than that achieved by RL or RC differentiator. In order to cope with this problem, $K_{13}$, $K_{14}$ are set different from $K_{11}$, $K_{12}$ and the corner frequency $f_{B2}$ is also set different from $f_{B1}$ of $B_1(f)$ to make the bandwidth of the equalization function in $D(f)$ slightly bigger than that of $C(f)$. Or in other words, the desired isolated pulse, 3b, shown in FIG. 3 is slightly overslimmed in the peak detection channel so that after the delay line differentiation function the amplitude equalized and differentiated pulse, 3c, will be well time-contained within $\pm t_o$ ($= \pm T_{min}$) from the peak repesentative zero-crossing just like the separately amplitude equalized pulse 3b which is also well time-contained within $\pm t_o$ nanoseconds for the gate generation channel.

FIG. 4 shows the relative amplitude of the Fourier transforms of the isolated pulse before and after equalization ($L(f)$, $S(f)$) and the transfer functions ($C(f)$, $D(f)$) of the circuit implementation disclosed in this invention for a particular case with the following signal characteristics: $T_{50} = 85$ nanoseconds, $t_o = T_{min} = 80$ nanoseconds, and system bandwidth $f_c = 16$ MHz.

To design the circuit parameters, $f_d = 1/T$ is set approximately equal to the system bandwidth $f_c$ and the corner frequencies $f_{B1}$, $f_{B2}$ are set to half of $f_c$. Then the required $H_{11}(f)$ is obtained by dividing $R(f)$ by $B_1(f)$. $K_{11}$, $K_{12}$ are then estimated to generate $C(f)$. The difference between $C(f)$ and $R(f)$ is then minimized by adjusting $K_{11}$, $K_{12}$, $f_{B1}$ and the number of poles of the Bessel Filter $B_1(f)$. The required $H_{12}(f)$ for the spectral shaping differentiator is obtained by dividing $N(f)/L(f)$ by $B_2(f)$. Then $K_{13}$, $K_{14}$ are estimated and adjusted with the proper choice of $f_{B2}$ and the number of poles of the Bessel filter $B_2(f)$ to generate the desirable equalization-differentiation function $D(f)$ with minimum error from $N(f)/L(f)$.

Figure 5:
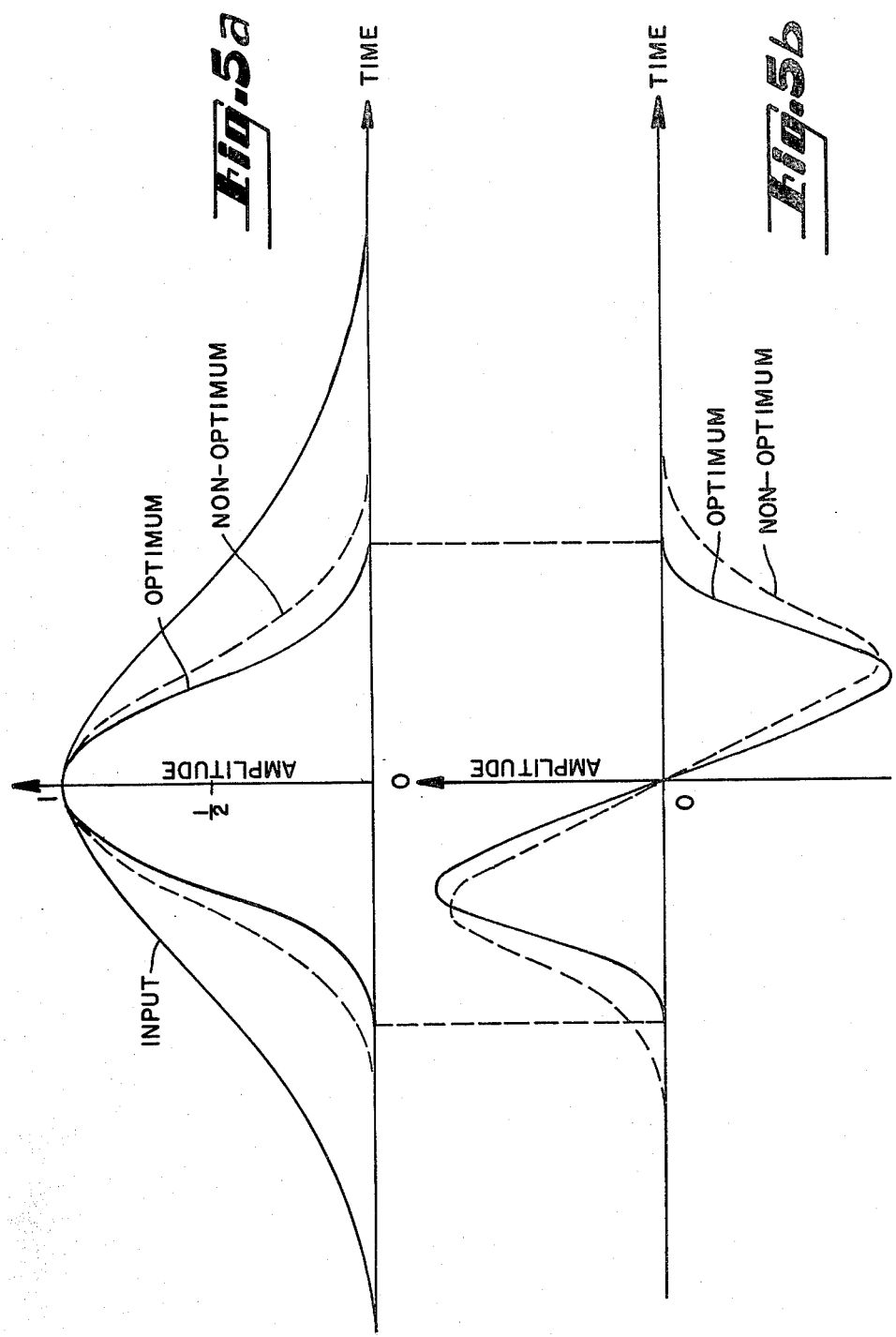
FIG. 5a shows graphs of signal amplitudes plotted against time for an isolated readback data pulse before and after slimming by the circuit of the present invention, showing optimum and non-optimum shapes.
FIG. 5b shows the optimum and non-optimum cases of the differentiation of a slimmed isolated pulse.

The selection of one Bessel filter for both channels or two different Bessel filters for each channel of a dual channel signal detector was discussed with reference to FIGS. 2a and 2b. In FIGS. 5a and 5b a qualitative indication is given of the effect of using and not using separate Bessel filters. In FIG. 5a an unequalized Lorentzian isolated input pulse is indicated by the waveform labeled "input". A slimmed input pulse labeled "optimum" is shown to be a slimmed version of the input pulse after being processed by the equalizer. The optimum pulse eliminates pulse crowding problem totally because its signal level drops to zero at the occurrence of the peaks of adjacent pulses. A less slim pulse, lying between the shape of the input pulse and the optimum pulse is labeled as a "non-optimum" pulse. The non-optimum pulse is still effective for the gate generation channel because it has been equalized, but it is not as desirable as the optimum pulse, which has steeper sides, enabling a greater degree of discrimination when pulse crowding occurs.

In FIG. 5b a well-slimmed, differentiated version of the input isolated pulse is shown in the optimum case, indicated by the solid line, as well as the non-optimum case, indicated by the dashed line. The optimum case eliminates pulse crowding completely while the non-optimum case still suffers from pulse crowding slightly when adjacent pulses are combined to form the resultant signal waveform whose zero-crossings will be shifted from the true positions if pulse crowding still exists. In both FIGS. 5a and 5b the difference between the optimum and the non-optimum case is that for the optimum case separate Bessel filters have been selected with characteristics especially suitable to each channel of a dual channel signal detector system, as shown in FIG. 2b. In the non-optimum case, a single Bessel filter, as shown in FIG. 2a, has been used for both channels. As a result it is necessary to compromise the performance of both channels. Only one channel can be made optimum while the other channel will be non-optimum from the standpoint of elimination of pulse crowding because delay line differentiator is used instead of ideal differentiator (j2πf). When one Bessel filter is used, the zero-crossing detection channel will be optimized and let the gate generation channel be non-optimum if the system can tolerate this compromise. The Bessel filter in either situation serves to limit the high frequency response of the system. Therefore Bessel filters for each respective channel should be selected with proper frequency response in conjunction with the equalization and differentiation functions generated by the circuit of the present invention shown in FIG. 1 in order to achieve optimum spectral shaping and differentiation for both channels.

Figure 6:
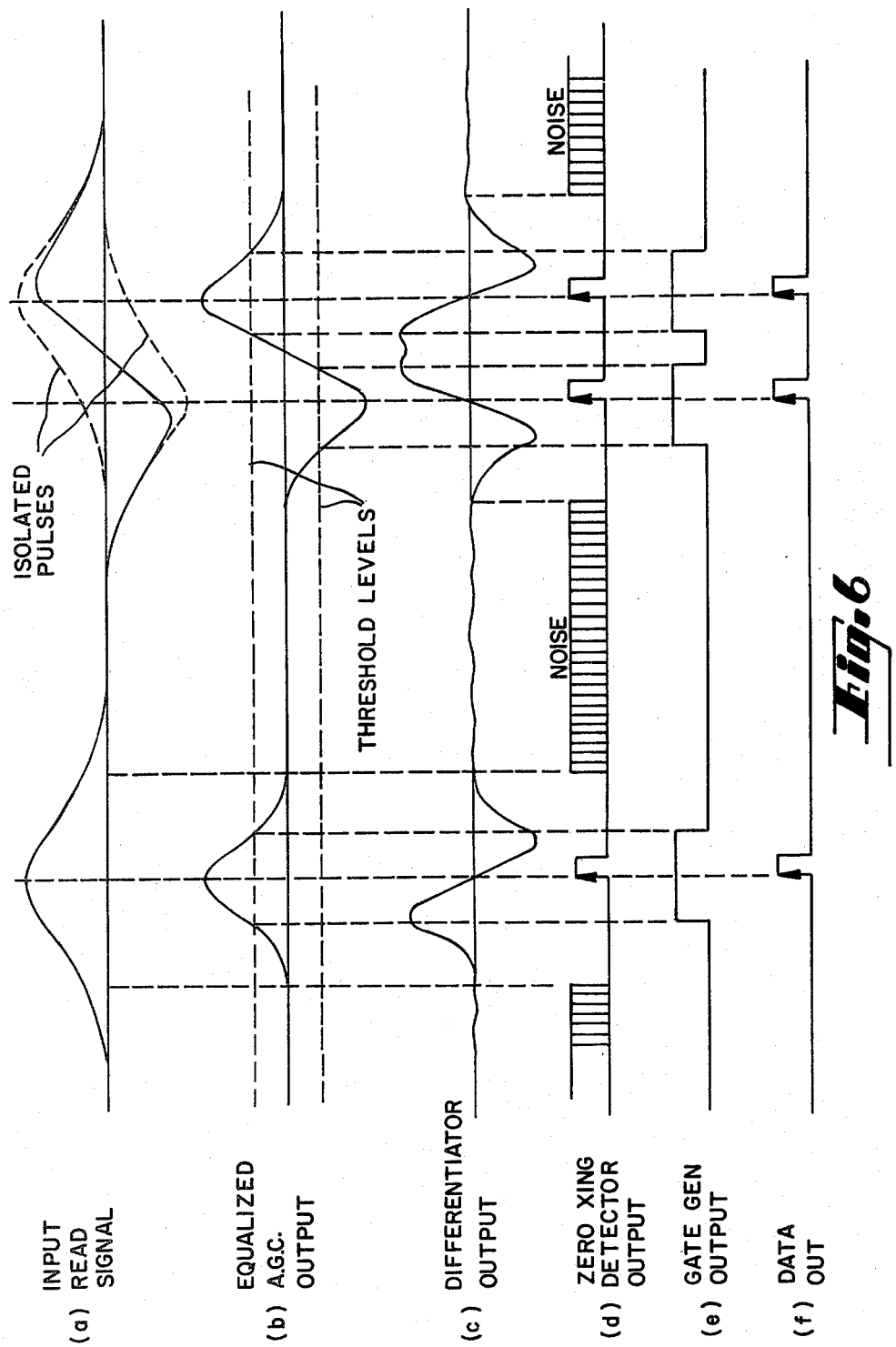
FIG. 6 shows waveforms indicating operation of the present invention in a dual channel data readback system.

The generation of data output from the circuit of the present invention may be understood more readily with reference to FIG. 6. The tapped delay line circuit of the present invention performs two functions, principally variable amplitude equalization or shaping as shown in plot (b) after automatic gain control, and differentiation as shown in plot (c). The shaped and gain controlled signal in plot (b) which is slimmed relative to the corresponding input signal of plot (a) and has fixed peak amplitude is measured with reference to positive and negative threshold levels, indicated by the horizontal dashed lines. The crossing of these threshold levels generates a gate generator output as shown in plot (e). The differentiated signal output is used to indicate peaks and such peaks are equivalent to zero crossings of the differentiated signal. Hence plot (d) shows the output of a zero crossing detector. In the intermediate region between full differentiated curves, there is some dithering of the differentiated signal about the zero level. This is reflected as noise in plot (d). Since both output signals from the circuit of present invention shown in FIG. 1 are delayed from the input by different amounts, the gate generator output is delayed digitally so that the zero crossing detector output is aligned to the center of the gating pulse. Plot (f) shows data out from the AND gate. The data output pulse occurs when the gate generator output and the zero crossing detector output are both high, therefore the gate generator output discriminates the true zero crossings from noise and the data output from the AND gate thus represent the true data written on the medium.

In summary, the current injection tapped delay line spectral shaping equalizer-differentiator circuit of the present invention provides a single simple circuit for a dual channel digital magnetic recording readback system whereby use of a single tapped delay line with its center fed by current input signal and appropriate summing means generate two balanced and differential output signals. One output signal is a shaped version of the input read signal for variable amplitude equalization and another output signal is the differentiated version of an amplitude equalized read signal. Both amplitude spectrum equalization functions for pulse slimming are not only provided by the same tapped delay line circuit termined at both ends with its characteristic impedances and configured in a balanced differential mode, but can also be made different to fit both amplitude detection and peak detection channels for optimum performance. This kind of implementation approaches can be extended for other functions by increasing the number of taps of the delay line, using different gain multipliers and summing signal components in a different fashion.

What is claimed is:

1. A signal amplitude equalizing and differentiating circuit comprising:
   a pair of differential input signal lines for receiving an input pulse-type signal,
   a delay line having first and second ends each terminated in an impedance equal to the delay line characteristic impedance, said delay line having at least two intermediate taps symmetrically spaced between said first and second ends and electrically connected to said pair of differential input lines,
   a voltage to current converter connected between the differential input signal lines and the two taps symmetrically spaced between the ends of the delay line for responding to the input signal to produce a differential current output for application to said symmetrically spaced taps, and
   a plurality of signal summing means connected to receive selected inputs from said first and second delay line ends, from intermediate taps and from the input lines through gain multipliers, said summing means having outputs combined differentially to form a first output signal which is an amplitude equalized version of the input signal and a second output signal which is an amplitude equalized and differentiated version of the input signal.

2. A dual channel system for detecting data signals comprising,
   input means for picking up a pulse-type signal and converting it to a balanced differential electrical input signal in a pair of differential input lines,
   a delay line having first and second ends and four intermediate taps symmetrically spaced therebetween dividing said delay line into five sections,
   a voltage-to-current converter connected to receive said input signal and having a pair of differential current output lines feeding two intermediate taps of said delay line symmetrically spaced relative to said ends,
   a first pair of summing means connected to selected intermediate taps and to said input lines through gain multipliers for forming a first balanced differential output signal being an amplitude equalized version of the input signal,
   a second pair of summing means connected to selected intermediate taps and to said ends of said delay line through gain multipliers for forming a second balanced differential output signal being an amplitude equalized and differentiated version of the input signal,
   two pairs of output lines from said first and second pair of summing means connected to differential amplifiers to generate the said first and second balanced differential output signals,
   an automatic gain control circuit coupled to receive said first output signal for forming a signal with predetermined and fixed peak amplitude which is independent of the input signal level, amplitude detection means coupled to the output of said automatic gain control circuit for producing a gating pulse corresponding to the fixed peak amplitude input signal exceeding a threshold level, zero crossing detection means coupled to receive said second output signal for producing a peak representative data pulse for each zero crossing indicative of a peak of said input signal, a digital delay circuit connected to receive said gating pulse and to delay the gating pulse, and logic output means coupled to receive said delayed gating pulse and said peak representative data pulse and to respond to said data pulse occurring in time coincidence with a delayed gate pulse for gating said data pulse to an output terminal of said circuit.

3. The system of claim 2 wherein a Bessel filter is connected intermediate said input means and said delay line circuit.

4. The system of claim 2 wherein a first Bessel filter is connected intermediate said delay line circuit and said zero crossing detection means and a second Bessel filter is connected intermediate said delay line circuit and said automatic gain control circuit followed by said amplitude detection means.

5. A signal equalizing and differentiating circuit comprising a delay line terminated at each end by an impedance equal to the delay line characteristic impedance and having a plurality of electrical taps disposed along the line and at each end thereof dividing the line into a plurality of sections, a pair of differential input lines coupled to a pair of taps (a, a') on a delay line section centrally disposed between the ends (c, c') of the delay line for coupling a differential input signal thereto, a plurality of signal summing means including at least first and second pairs of signal summing devices each of which is adapted to sum at least three signals, said first pair of signal summing devices having each summing device coupled to receive a first signal from one of the differential input lines, a second signal from a tap on the delay line and a third signal from another tap on the delay line, and said second pair of signal summing devices having each summing device coupled to receive a fourth signal from an end of the delay line, a fifth signal from a tap on the delay line and a sixth signal from another tap on the delay line, and a plurality of differential signal combining means including at least first and second differential signal combining means, said first differential signal combining means being coupled to receive signals produced at the outputs of said first pair of signal summing devices to provide a signal which is an equalized version of the differential input signal, and said second differential signal combining means being coupled to receive signals produced at the outputs of said second pair of signal summing devices to provide a signal which is an equalized and differentiated version of the differential input signal.

6. The apparatus of claim 5 wherein all sections of the delay line are characterized by equal delay.

7. The apparatus of claim 6 wherein the equalized version of the differential input signal comprises signal components which are delayed relative to the differential input signal with delays ranging from zero to two time delays, and the equalized and differentiated version of the differential input signal comprises signal components which are delayed relative to the differential input signal with delays ranging from zero to three time delays.

8. The apparatus of claim 7 wherein the first, second and third signals received by each summing device of the first pair of summing devices are coupled to such summing devices through first, second and third gain multipliers respectively, and wherein the first and third signals received by each summing device of the second pair of summing devices are coupled to such summing device through a fourth gain multiplier and the second signal received by each summing device of the second pair of summing devices is coupled to such summing device through a gain multiplier equal to said second gain multiplier.

9. The apparatus of claim 8 wherein the delay line includes taps (a, a') on the centrally disposed delay line section, taps (c, c') at the ends of the delay line, a tap (b) intermediate taps (a) and (c) and a tap (b') intermediate taps (a') and (c') and wherein for the first summing device of the first pair of summing devices the first signal is derived from the differential input line coupled to tap (a), the second signal is derived from tap (b') and the third signal is derived from the differential input coupled to tap (a), for the second summing device of the first pair of summing devices the first input is derived from tap (a'), the second signal is derived from tap (b) and the third signal is derived from the differential input coupled to tap (a'), for the first summing device of the second pair of summing devices the first signal is derived from tap (c), the second signal is derived from tap (a) and the third signal is derived from tap (b), and for the second summing device of the second pair of summing devices the first signal is derived from tap (c'), the second signal is derived from tap (a') and the third signal is derived from tap (b').

10. The apparatus of claim 6 including a voltage to current converter connected to receive the differential input signal and apply current representation thereof to the delay line.

11. The apparatus of claim 10 wherein the first, second and third signals received by each summing device of the first pair of summing devices are coupled to such summing devices through first, second and third gain multipliers respectively, and wherein the first and third signals received by each summing device of the second pair of summing devices are coupled to such summing device through a fourth gain multiplier and the second signal received by each summing device of the second pair of summing devices is coupled to such summing device through a gain multiplier equal to said second gain multiplier.

12. The apparatus of claim 11 wherein the delay line includes taps (a, a') on the centrally disposed delay line section, taps (c, c') at the ends of the delay line, a tap (b) intermediate taps (a) and (c) and a tap (b') intermediate taps (a') and (c') and wherein for the first summing device of the first pair of summing devices the first signal is derived from the differential input line coupled to tap (a), the second signal is derived from tap (b') and the third signal is derived from the differential input coupled to tap (a), for the second summing device of the first pair of summing devices the first input is derived from tap (a'), the second signal is derived from tap (b) and the third signal is derived from the differential input coupled to tap (a'), for the first summing device of the second pair of summing devices the first signal is derived from tap (c), the second signal is derived from tap (a) the third signal is derived from tap (b), and for the second summing device of the second pair of summing devices the first signal is derived from tap (c'), the second signal is derived from tap (a') and the third signal is derived from tap (b').

* * * * *